US012812887B2

(12) United States Patent
Karalkar et al.

(10) Patent No.: US 12,812,887 B2
(45) Date of Patent: Nov. 24, 2026

(54) DEVICE TRIGGERED SILICON CONTROL RECTIFIER

(71) Applicant: GlobalFoundries U.S. Inc., Malta, NY (US)

(72) Inventors: Sagar Premnath Karalkar, North Chelmsford, MA (US); Alain François Loiseau, Williston, VT (US); Meng Miao, Williston, VT (US); Anindya Nath, Essex Junction, VT (US); Wei Liang, South Burlington, VT (US); Souvick Mitra, Essex Junction, VT (US); Rajendran Krishnasamy, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 305 days.

(21) Appl. No.: 18/403,235

(22) Filed: Jan. 3, 2024

(65) Prior Publication Data

US 2025/0220940 A1 Jul. 3, 2025

(51) Int. Cl.
*H10D 18/00* (2025.01)
*H10D 89/60* (2025.01)

(52) U.S. Cl.
CPC ........... *H10D 18/251* (2025.01); *H10D 89/60* (2025.01)

(58) Field of Classification Search
None
See application file for complete search history.

(56) References Cited

U.S. PATENT DOCUMENTS

| | | | |
|---|---|---|---|
| 5,825,600 | A | 10/1998 | Watt |
| 6,605,493 | B1 | 8/2003 | Yu |
| 6,770,918 | B2 | 8/2004 | Russ et al. |
| 7,514,751 | B2 | 4/2009 | Vashchenko et al. |
| 8,120,887 | B2 | 2/2012 | Mallikararjunaswamy et al. |
| 9,324,849 | B2 | 4/2016 | Chung |
| 9,882,003 | B1 | 1/2018 | Aharoni |
| 10,727,327 | B2 | 7/2020 | Mishra et al. |

(Continued)

FOREIGN PATENT DOCUMENTS

| | | | |
|---|---|---|---|
| CN | 102130155 | A | 7/2011 |
| CN | 105374816 | A | 3/2016 |

(Continued)

OTHER PUBLICATIONS

Markus P.J. Mergens et al., " Diode-Triggered SCR (DTSCR) for RF-ESD Protection of BiCMOS SiGe HBTs and CMOS Ultra-Thin Gate Oxides" IEEE International Electron Devices Meeting 2003, Washington, DC, USA, 2003, 4 pages.

(Continued)

*Primary Examiner* — Nduka E Ojeh
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to a device triggered silicon control rectifier (SCR) and methods of manufacture. The structure includes: a vertical silicon controlled rectifier; a lateral triggering device including a first diffusion region, a second diffusion region and a third diffusion region, the third diffusion region being shared with the vertical silicon controlled rectifier; and a body contact over the first diffusion region.

19 Claims, 9 Drawing Sheets

(56) References Cited

U.S. PATENT DOCUMENTS

| | | | | |
|---|---|---|---|---|
| 2003/0047750 | A1 | 3/2003 | Russ et al. | |
| 2004/0110353 | A1 | 6/2004 | Mallikarjunaswamy | |
| 2007/0023866 | A1* | 2/2007 | Chatty | H10D 89/713 257/E29.183 |
| 2007/0279824 | A1 | 12/2007 | Mallikararjunaswamy | |
| 2008/0218922 | A1 | 9/2008 | Mallikararjunaswamy et al. | |
| 2010/0001783 | A1 | 1/2010 | RonsisValle et al. | |
| 2011/0068364 | A1 | 3/2011 | Abou-Khalil et al. | |
| 2011/0163384 | A1 | 7/2011 | Takasu | |
| 2014/0339603 | A1 | 11/2014 | Kuo et al. | |
| 2016/0285262 | A1 | 9/2016 | Chao | |
| 2017/0062406 | A1 | 3/2017 | Ko et al. | |
| 2018/0012961 | A1 | 1/2018 | Aharoni | |
| 2019/0051646 | A1 | 2/2019 | Salcedo et al. | |
| 2019/0237568 | A1 | 8/2019 | Mishra et al. | |
| 2020/0411504 | A1* | 12/2020 | Mitra | H10D 89/611 |
| 2021/0280699 | A1* | 9/2021 | Nath | H10D 84/121 |
| 2022/0352144 | A1* | 11/2022 | Nam | H10D 18/251 |
| 2023/0163123 | A1* | 5/2023 | Vendt | H10D 84/619 257/146 |

FOREIGN PATENT DOCUMENTS

| | | | |
|---|---|---|---|
| CN | 105552074 | A | 5/2016 |
| CN | 107731811 | A | 2/2018 |
| CN | 112838123 | A | 5/2021 |
| DE | 102006022105 | | 11/2007 |
| WO | 2020047903 | A1 | 3/2020 |

OTHER PUBLICATIONS

Jing Liu et al., "A Novel High Holding Voltage ESD device based on SCR and SiGe", Journal of Physics: Conference Series, vol. 2370, 2022 International Symposium on Semiconductor and Electronic Technology (ISSET 2022) Aug. 12, 2022-Aug. 14, 2022 Fuzhou, China, 7 pages.

Specification and Drawings filed Dec. 4, 2023 in related U.S. Appl. No. 18/528,223, 26 pages.

Srivatsan Parthasarathy et al., "Design of SCR devices for SiGe BiCMOS applications," 2011 IEEE Bipolar/BiCMOS Circuits and Technology Meeting, Atlanta, GA, USA, 2011, pp. 235-238, doi: 10.1109/BCTM.2011.6082789, Abstract, 2 pages.

Feibo Du et al., "Vertical bipolar junction transistor triggered silicon-controlled rectifier for nanoscale ESD engineering", Electronics Letters, Mar. 30, 2020, vol. 56, No. 7 pp. 350-351, https://doi.org/10.1049/el.2019.3864, 3 pages.

H. Xie et al., "A New Low-Parastic Polysilicon SCR ESD Protection Structure for RF ICs" in IEEE Electron Device Letters, vol. 26, No. 2, Feb. 2005, pp. 121-123, 3 pages; DOI: 101109/LED.2004.841860.

L. Changjun et al., "A low-voltage triggering SCR for ESD protection in a 0.35um SiGe BiCMOS process", 2016 IEEE International Nanoelectronics Conference (INEC), Chengdu, China, 2016, pp. 1-2, 2 pages; DOI: 10.1109/INEC.2016.7589450.

Specification and Drawings filed Nov. 9, 2023 in related U.S. Appl. No. 18/388,441, 25 pages.

Hailian Liang, et.al "Design of a Gate Diode Triggered SCR for Dual-Direction High-Voltage ESD Protection", in IEEE Electron Device Letters, vol. 40, No. 2, pp. 163-166, Feb. 2019, doi: 10.1109/LED.2018.2890105, Abstract, 4 pages.

Ming-Dou Ker, et al. "Native-NMOS-Triggered SCR With Faster Turn-On Speed for Effective ESD Protection in a 0.13-μm CMOS Process", in IEEE Transactions on Device and Materials Reliability, vol. 5, No. 3, Sep. 2005, 13 pages.

Christian C. Russ et.al., "GGSCRs: GGNMOS Triggered Silicon Controlled Rectifiers for ESD Protection in Deep Sub-Micron CMOS Processes", 2001 Electrical Overstress/Electrostatic Discharge Symposium, Portland, OR, USA, 2001, pp. 22-31, Abstract, 4 pages.

Fei Ma et al., "Comparison of different MOS-triggered SCR structures for on-chip ESD protection", ICCRD2011—2011 3rd International Conference on Computer Research and Development. 3. 10.1109/ICCRD.2011.5764207, Abstract, 3 pages.

The European Search Report dated Oct. 2, 2024 in EU Application No. 24172309.7-1001; 8 pages.

The European Search Report dated Oct. 14, 2024 in EU Application No. 24172310.5-1001; 8 pages.

Notice of Allowance and Fees dated Mar. 3, 2025 in U.S. Appl. No. 18/654,293, 10 pages.

Extended European Search Report and Opinion dated Feb. 28, 2025 for European Application No. EP 24181555.4-1211, 11 pages.

Parthasarathy et al., "Design of SCR Devices for Si Ge BiCMOS Applications." Bipolar/Bicmos Circuits and Technology Meeting (BCTM), 2011 IEEE, IEEE, Oct. 9, 2011 (Oct. 9, 2011), pp. 235-238, XP032011158, DOI: 10.1109/BCTM.2011.6082789 ISBN: 978-1-61284-165-6, 4 Pages.

Song et al., "Compact MOS-triggered SCR with faster turn-on speed for ESD protection." https://ieeexplore.ieee.org/document/5764207, 2011 3rd International Conference on Computer Research and Development, Mar. 11-13, 2011, 5 Pages.

Extended European Search Report and Opinion dated Feb. 28, 2025 for European Application No. EP 24207961.4-1211, 11 pages.

Du et al., "Vertical bipolar 1-9, 15 junction transistor triggered silicon-controlled rectifier for nanoscale ESD engineering", Electronics Letters, the Institution of Engineering and Technology, GB, vol. 56, No. 7, Mar. 30, 2020 (Mar. 30, 2020), pp. 350-351, XP006089832, ISSN: 0013-5194, DOI: 10.1049/EL.2019.3864, 2 Pages.

Specification and Drawings filed Jan. 3, 2024 in related U.S. Appl. No. 18/403,206, 23 pages.

EPO Communication dated Nov. 15, 2024 in EU Application No. 24207961.4-1211; 2 pages.

Non-Final Rejection dated Nov. 7, 2024 in U.S. Appl. No. 18/654,293, 16 Pages.

Response to Restriction Requirement dated Aug. 30, 2024 in U.S. Appl. No. 18/654,293, 2 Pages.

Office Action in U.S. Appl. No. 18/528,223 dated May 21, 2026 10 pages.

* cited by examiner

DEVICE TRIGGERED SILICON CONTROL RECTIFIER

BACKGROUND

The present disclosure relates to semiconductor structures and, more particularly, to a device triggered silicon control rectifier (SCR) and methods of manufacture.

SCRs are used for electrostatic discharge (ESD) protection of integrated circuits (ICs) from the sudden flow of electricity caused by, for example, contact, electrical shorts, or dielectric breakdown. Because of high current handling ability per unit area of an SCR, ESD devices utilizing SCR can protect ICs from failure. These devices are most often used in high performance analog and radiofrequency (RF) designs for chips that have large signal swings, low leakage, and low capacitance. Due to the capacitance loading and poor harmonics of SCRs, RF performance may be impacted.

SUMMARY

In an aspect of the disclosure, a structure comprises: a vertical silicon controlled rectifier; a lateral triggering device comprising a first diffusion region, a second diffusion region and a third diffusion region, the third diffusion region being shared with the vertical silicon controlled rectifier; and body contact over the first diffusion region.

In an aspect of the disclosure, a structure comprises: a vertical silicon controlled rectifier; and a lateral transistor configured to trigger the vertical silicon controlled rectifier, the lateral triggering device comprising: a first diffusion region of a first dopant type in the semiconductor substrate; a second diffusion region of a second dopant type in the semiconductor substrate; and a third diffusion region of the first dopant type in the semiconductor substrate.

In an aspect of the disclosure, a method comprises: forming a vertical silicon controlled rectifier; forming a lateral triggering device comprising a first diffusion region, a second diffusion region and a third diffusion region, the third diffusion region being shared with the vertical silicon controlled rectifier; and forming a body contact tied to the first diffusion region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a device triggered silicon control rectifier (SCR) and methods of manufacture. In embodiments, the device triggered SCR may be a vertical bipolar transistor with a lateral triggering device. The triggering device may be an NPN or PNP and the SCR may be a PNPN or NPNP. Advantageously, the structures described herein exhibit lowered trigger voltage and faster switching times.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
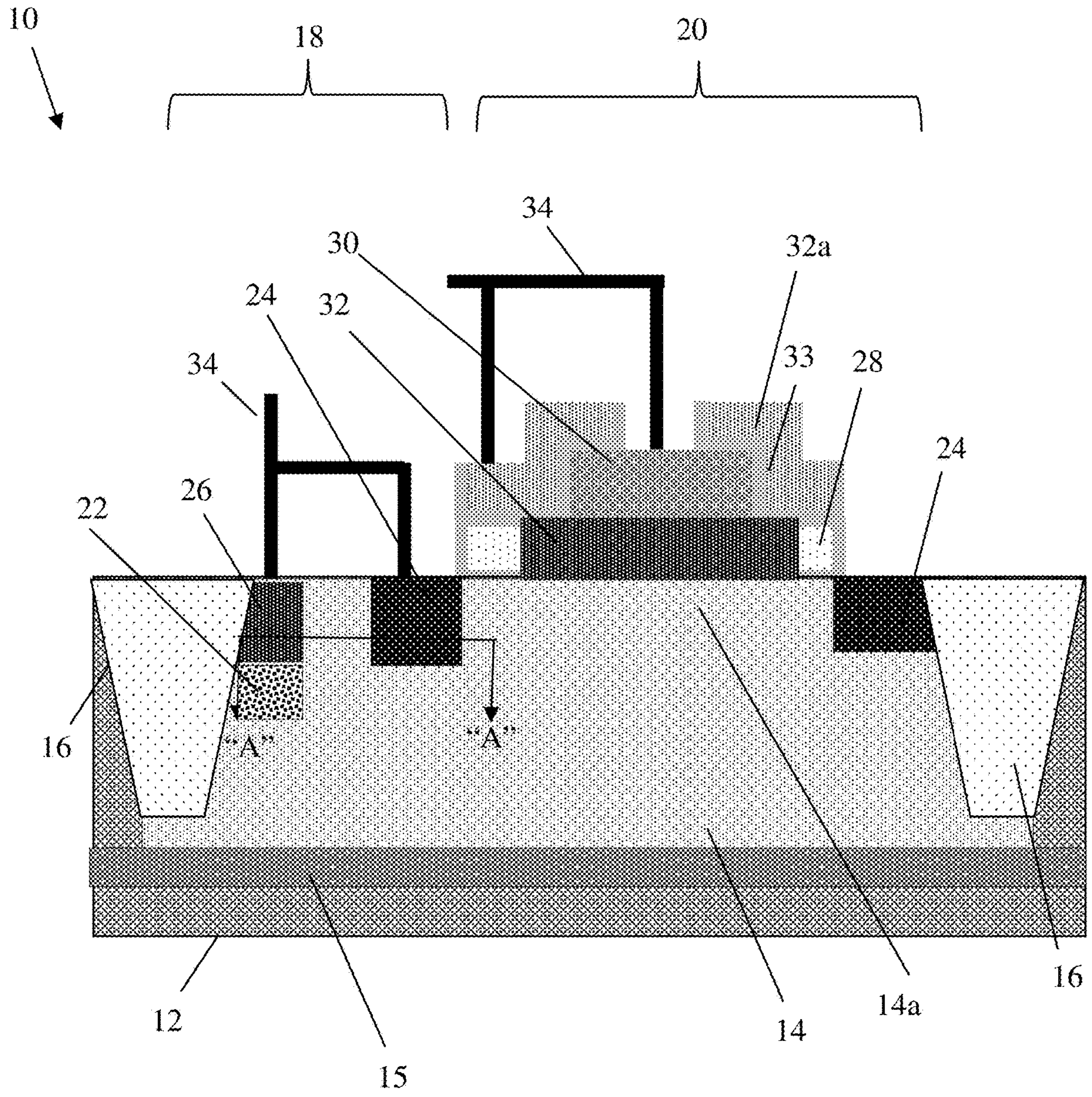
FIG. 1 shows a device triggered silicon control rectifier (SCR) and respective fabrication processes in accordance with aspects of the present disclosure.

FIG. 1 shows a device triggered silicon control rectifier (SCR) and respective fabrication processes in accordance with aspects of the present disclosure. The structure 10 of FIG. 1 includes a triggering device 18 and SCR 20 over p-well 14 in a semiconductor substrate 12. The p-well 14 may be formed by a conventional ion implantation process with p-type dopants, e.g., Boron (B), as is known in the art such that no further explanation is required for a complete understanding of the present disclosure. The p-well 14 may be provided within or bounded by a deep n-well 15 used to isolate the p-well 14. Deep trench isolation structures 16 may also be used to isolate the p-well 14, e.g., isolate the triggering device 18 and the SCR 20.

The semiconductor substrate 12 may be composed of any suitable semiconductor material including, but not limited to, Si, SiGe, SiGeC, SiC, GaAs, InAs, InP, and other III/V or II/VI compound semiconductors. The semiconductor substrate 12 may also comprise any suitable single crystallographic orientation (e.g., a (100), (110), (111), or (001) crystallographic orientation). In further embodiments, the semiconductor substrate 12 may be a bulk substrate comprising the semiconductor materials described herein or, alternatively, may comprise semiconductor on insulator technology as is known in the art. In the semiconductor on insulator technology, the semiconductor substrate 12 would be a top semiconductor layer over an insulator material and a handle substrate as is known in the art.

In embodiments, the structure 10 includes a triggering device 18 and an SCR 20. The triggering device 18 may be a lateral NPN device (transistor); whereas the SCR 20 may be a vertical PNPN SCR. In embodiments, the triggering device 18 may be a triggering device for the SCR 20.

The triggering device 18 includes an N+ diffusion region 22 and N+ diffusion region 24 within the p-well 14, e.g., tied directly to the p-well 14. In this way, the triggering device 18 is an NPN device. A P+ body contact 26 is provided over the N+ diffusion region 22. The N+ diffusion region 22 may partially cover the P+ body contact 26 and may also include N+ contacts (not shown in this view). The N+ diffusion region 24 and the P+ body contact 26 may include a fully or partially silicide region on a top surface.

The vertical SCR 20 includes a P+ emitter 30, N+ base region 32 and the N+ diffusion region 24. As noted herein, the N+ diffusion region 24 is shared with the triggering device 18 and the SCR 20. In addition, the SCR 20 includes a p+ collector region 14*a* in the p-well 14, between the base region 32 and the N+ diffusion region 24. In this way, the SCR 20 is a PNPN device.

The N+ base region 32 may be laterally separated from the N+ diffusion region 24 by sidewall spacers 28. In embodiments, the sidewall spacers 28 may be an oxide material, nitride material or combinations thereof. The base region 32 may include an extrinsic base region 32*a* (e.g., N+ tap region) in direct contact with the base region 32. The N+ tap region 32*a* may be isolated from the P+ emitter 30 by insulator material 33. Also, the base region 32*a* and the P+ body contact 26 may include a fully or partially silicide region on a top surface.

The P+ emitter 30 may comprise polysilicon material and the base region 32 may comprise, e.g., n-doped SiGe. The n-doped SiGe may be epitaxially grown on the semiconductor substrate 12, with an in-situ doping. In embodiments, the in-situ doping may be n-type dopants, e.g., Arsenic (As), Phosphorus (P) and Antimony (Sb), among other suitable examples.

The extrinsic base region 32*a*, P+ emitter 30, N+ diffusion region 24 and P+ body contact 26 are connected to wiring structures 34. In embodiments, the N+ diffusion region 24 is connected to the cathode and the P+ emitter 30 is connected to the anode. The N+ diffusion region 22 is also connected to the anode.

Figure 2:
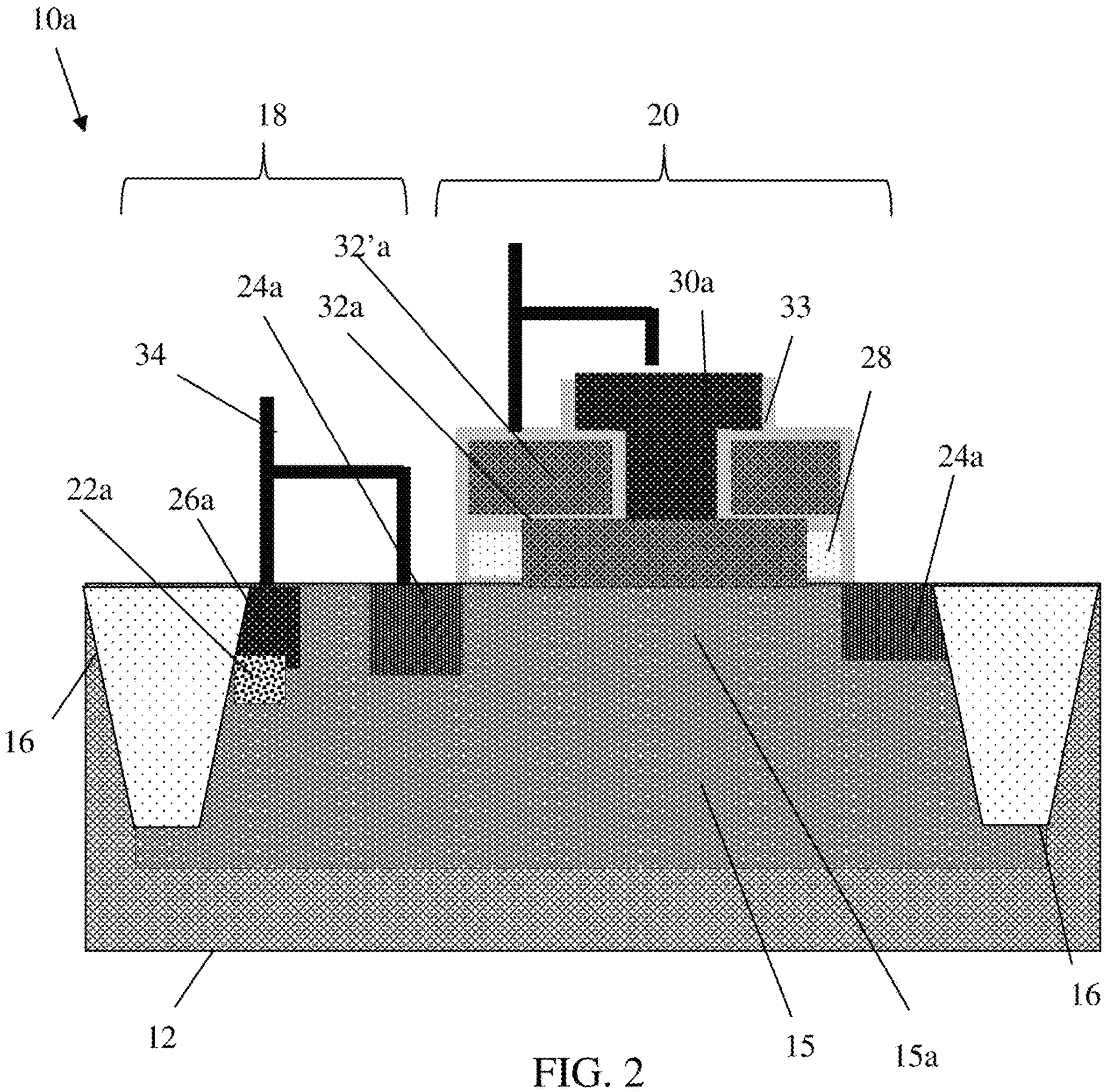
FIGS. 2-6 show device triggered SCRs and respective fabrication processes in accordance with additional aspects of the present disclosure.

FIG. 2 shows a device triggered SCR in accordance with additional aspects of the present disclosure. The structure 10*a* of FIG. 2 includes a lateral PNP device 18 and a vertical NPNP SCR 20. The lateral PNP device 18 may be a triggering device for the SCR 20.

In embodiments, the structure 10*a* includes an n-well 15 in the semiconductor substrate 12. The n-well 15 may be formed by a conventional ion implantation process with n-type dopants, e.g., Arsenic (As), Phosphorus (P) and Antimony (Sb), among other suitable examples as is known in the art. The deep trench isolation structures 16 may be used to isolate the n-well 15, e.g., the triggering device 18 and the SCR 20. The semiconductor substrate 12 may be composed of any suitable semiconductor material with any suitable single crystallographic orientation as already disclosed herein. In further embodiments, the semiconductor substrate 12 may be a bulk substrate or, alternatively, may comprise semiconductor on insulator technology as is known in the art.

Still referring to FIG. 2, the triggering device 18 includes a P+ diffusion region 22*a* and P+ diffusion region 24*a* within the n-well 15, e.g., tied directly to the n-well 15. In embodiments, the P+ diffusion region 22*a* comprises a P-type region with a P+ diffusion connected in a $3^{rd}$ dimension. In this way, the triggering device 18 is a PNP device. An N+ body contact 26*a* may partially cover the P+ diffusion region 22*a*. The P+ diffusion region 24*a* and the N+ body contact 26*a* may include a fully or partially silicide region on a top surface.

The vertical SCR 20 includes an N+ emitter 30*a*, P+ base region 32*a*, a collector region 15*a* in the n-well 15, and the P+ diffusion region 24*a*. In this way, the SCR 20 is an NPNP device. As noted herein, the P+ diffusion region 24*a* is shared with the triggering device 18 and the SCR 20.

The P+ base region 32*a* may be laterally separated from the P+ diffusion region 24*a* by sidewall spacers 28, e.g., oxide material, nitride material or combinations thereof. The base region 32*a* may include an extrinsic base region 32'*a* (e.g., P+ tap region) in direct contact with the base region 32*a*. The N+ emitter 30*a* may comprise polysilicon material and the base region 32*a* may comprise, e.g., p-doped SiGe epitaxially grown on the semiconductor substrate 12 with an in-situ doping, e.g., p-type dopants. The P+ body contact 26*a* is tied to the n-well 15, adjacent to and electrically connected to the N+ diffusion region 22*a*.

The extrinsic base region 32*a*, N+ emitter 30*a*, P+ diffusion region 24*a* and N+ body contact 26*a* are connected to wiring structures 34. In embodiments, the P+ diffusion region 24*a* is connected to the anode and the N+ emitter 30*a* and base region 32*a* are connected to the cathode. The P+ diffusion region 22*a* is also connected to the cathode.

Figure 3:
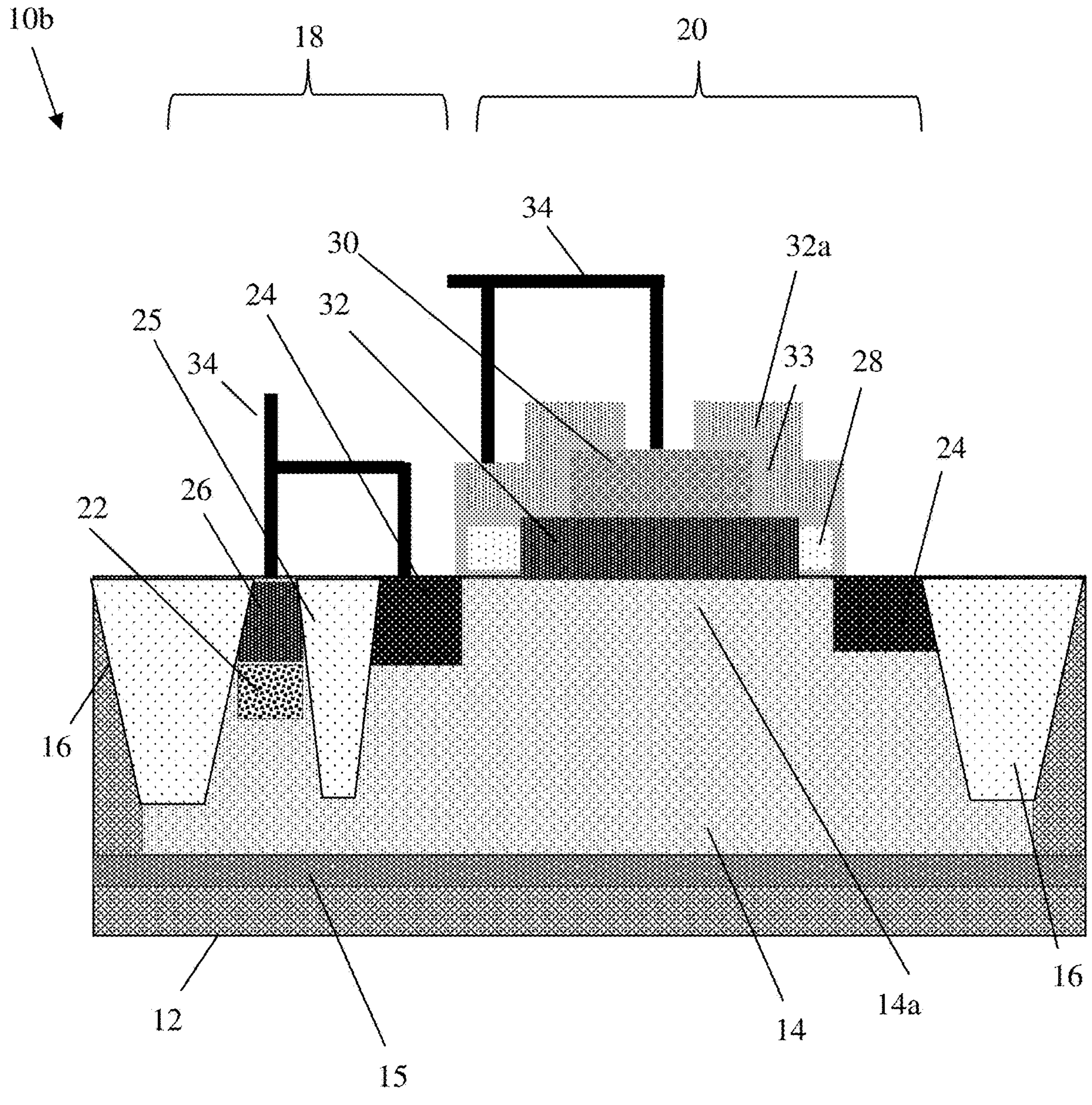

FIGS. 3-6 shows additional device triggered SCRs in accordance with aspects of the present disclosure. In FIG. 3, for example, the structure 10*b* includes the N+ diffusion region 24 isolated from the P+ body contact 26 by a shallow trench isolation structure 25. In embodiments, the depth of the shallow trench isolation structure 25 may be adjustable. For example, the shallow trench isolation structure 25 may be the same depth or a different depth than the deep trench isolation structure 16. The use of the shallow trench isolation structure 25 provides a deeper current path in the semiconductor substrate 12. Therefore, as should be understood by those of skill in the art, a higher current will be required to trigger the SCR 20. The remaining features of the structure 10*b* are similar to the structure 10 of FIG. 1.

Figure 4:
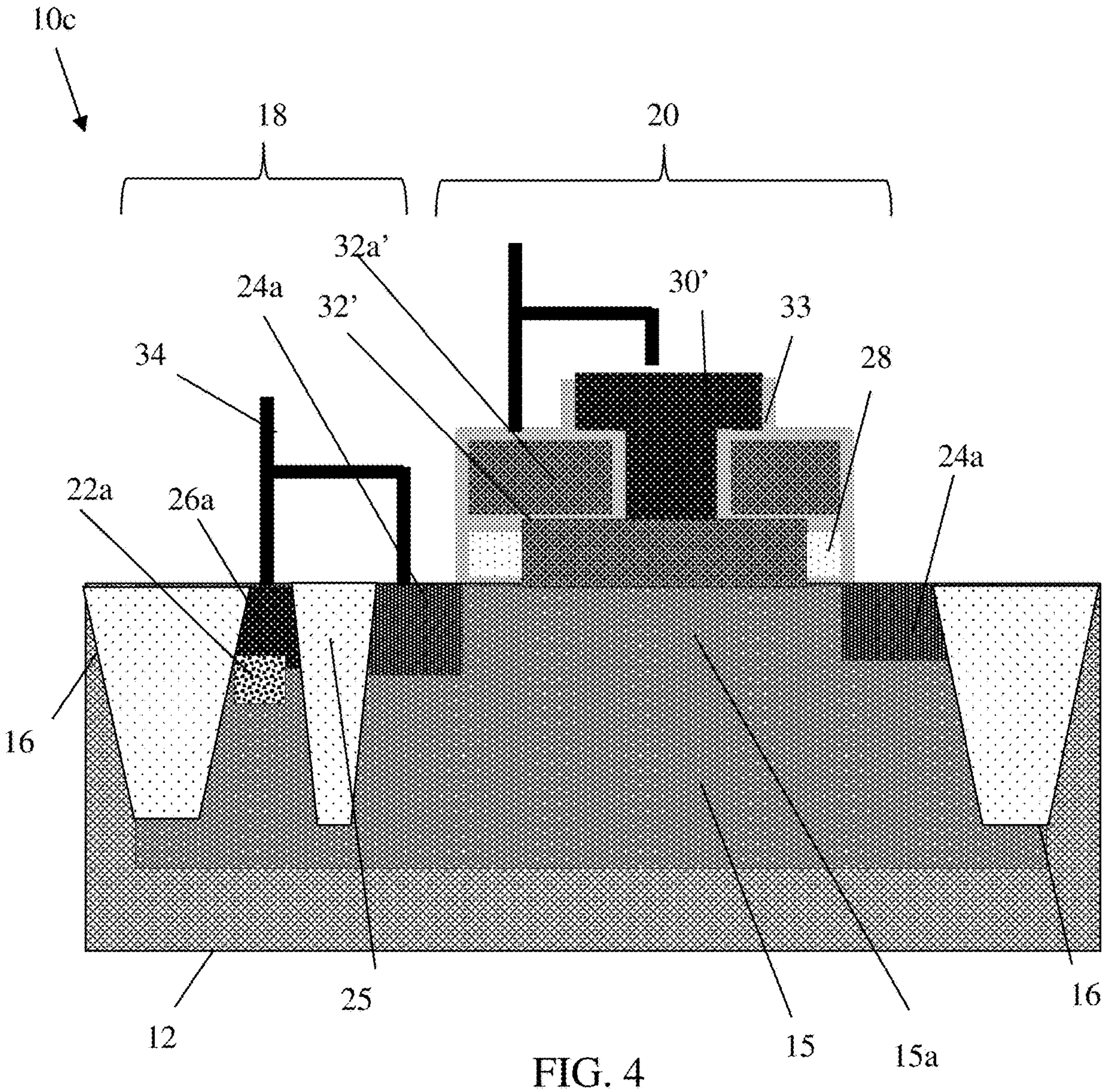

Similarly, in FIG. 4, the structure 10*c* includes the P+ diffusion region 24*a* isolated from the N+ body contact 26*a* by the shallow trench isolation structure 25. As already disclosed herein, the use of the shallow trench isolation structure 25 provides a deeper current path and, hence, a higher current to trigger the SCR 20. The remaining features of the structure 10*c* are similar to the structure 10*a* of FIG. 2.

Figure 5:
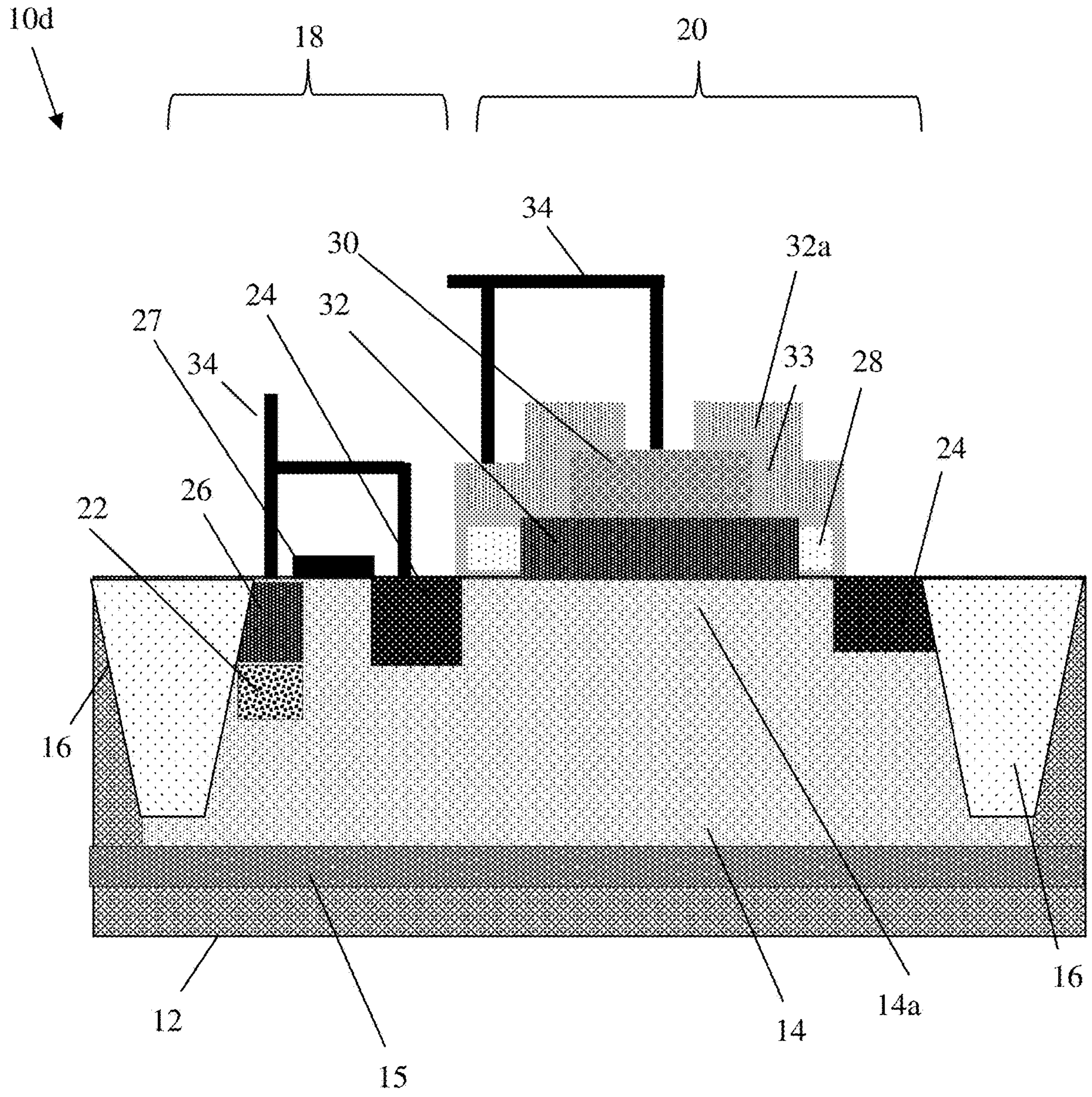
Figure 6:
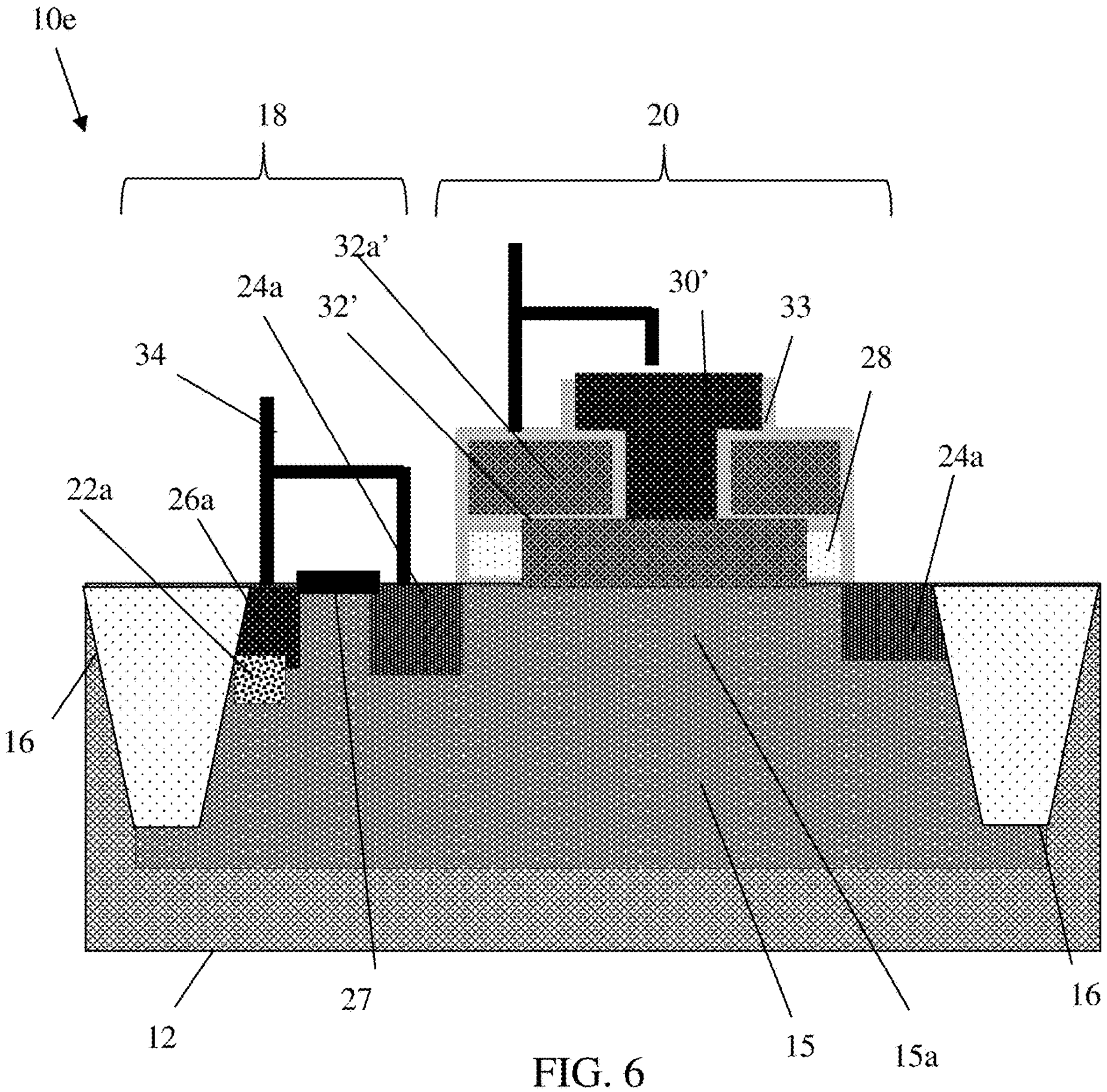

In FIG. 5, the structure 10*d* includes a silicide block 27 bridging between the N+ diffusion region 24 and the P+ body contact 26. The remaining features of the structure 10*b* are similar to the structure 10 of FIG. 1. Similarly, in FIG. 6, the structure 10*e* includes the silicide block 27 bridging the P+ diffusion region 24*a* and the N+ body contact 26*a*. The remaining features of the structure 10*c* are similar to the structure 10*a* of FIG. 2. As should be understood by those of skill in the art, the silicide block 27 will lower a current needed to trigger the SCR 20 and, hence, improve Ron resistance.

Figure 7:
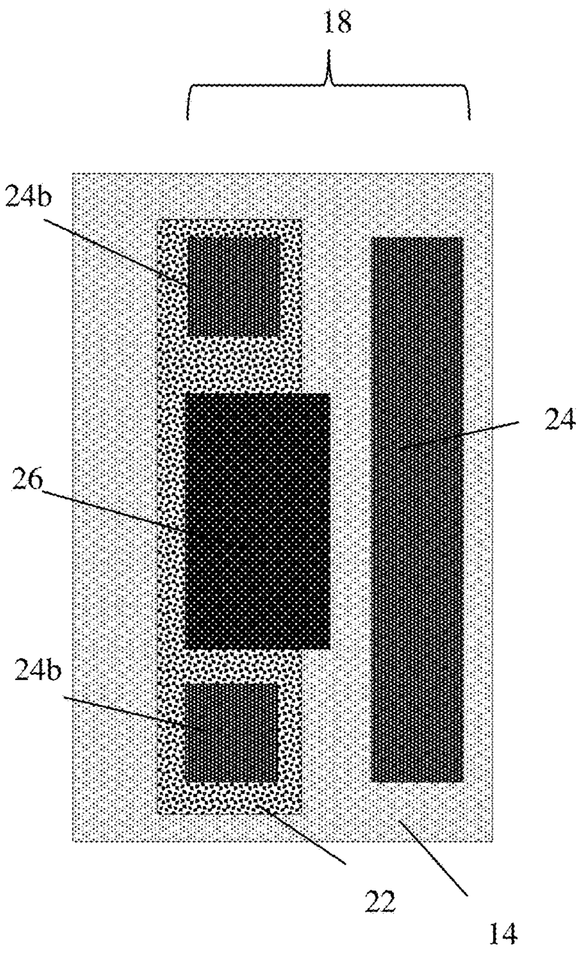
FIGS. 7 and 8 show top views of different triggering devices across line A-A of FIG. 1 in accordance with aspects of the present disclosure.
Figure 8:
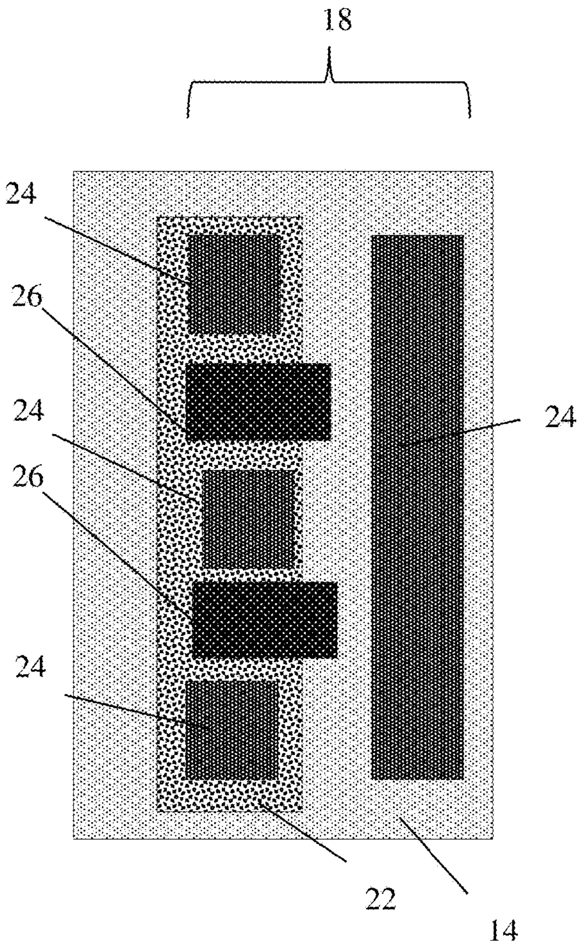

FIGS. 7 and 8 show alternative top views of the triggering device 18 along line A-A of FIG. 1. It should be recognized by those of skill in the art that the top views shown in FIGS. 7 and 8 may equally represent the structure 10*a* of FIG. 2 by simply changing the dopant types.

In FIG. 7, the triggering device 18 includes the P+ body contact 26 over the N+ diffusion region 22. In embodiments, the P+ body contact 26 will extend beyond an edge of the N+ diffusion region 22 and into the p-well 14. The N+ diffusion region 24 will be in the p-well 14. Additional N+ diffusion regions 24*b* will be over the N+ diffusion region 22, adjacent to ends of the P+ body contact 26. In this embodiment, the N+ diffusion regions 24*b* comprise two tabs located at opposing ends of the P+ body contact 26.

In FIG. 8, the triggering device 18 includes alternating tabs comprising the N+ diffusion regions 24*b* interdigitated with the P+ body contacts 26, over the N+ diffusion region 22. As in the embodiment of FIG. 4, the P+ body contacts 26 will extend beyond an edge of the N+ diffusion region 22 and into the p-well 14.

FIGS. 9A-9D show cross-sectional views of steps in the fabrication processes of the device triggered SCR of FIG. 1.

It should be recognized by those of skill in the art that the fabrication processes shown in FIGS. 9A-9D may equally represent fabrication processes of the device triggered SCR of FIGS. 2-8 by changing dopant types, in addition to adding shallow trench isolation structures and/or silicide regions.

Figure 9A:
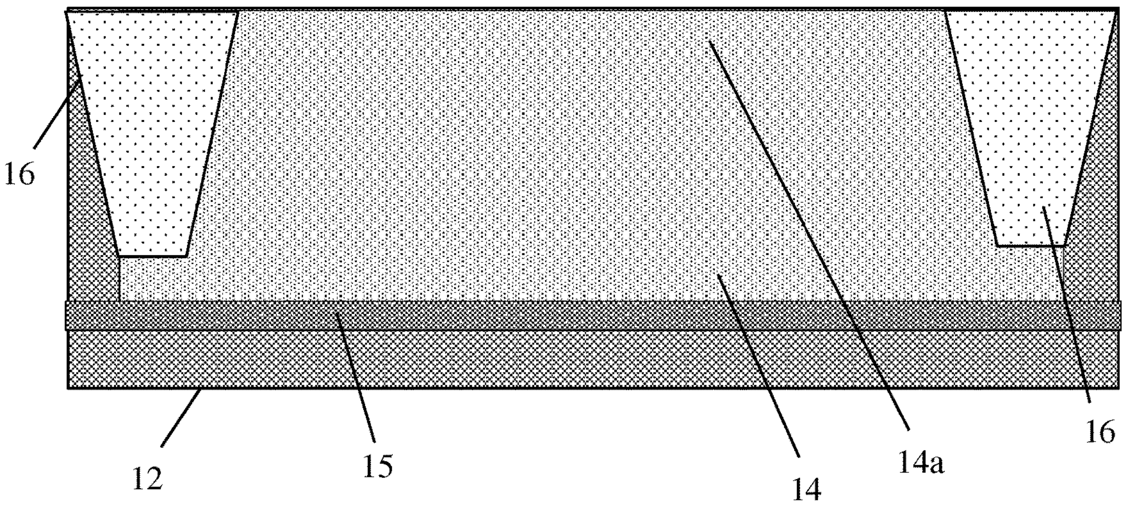
FIGS. 9A-9D show cross-sectional views of steps in the fabrication processes of the device triggered SCR of FIG. 1 in accordance with further aspects of the present disclosure.

As shown in FIG. 9A, for example, a p-well 14 is provided with the semiconductor substrate 12 using a conventional ion implantation process as is known in the art. The p-well 14 may be provided within or bounded by a deep n-well 15 used to isolate the p-well 14. The deep n-well 15 may be formed by also using a conventional ion implantation process as is known in the art.

Deep trench isolation structures 16 are formed in the semiconductor substrate 12, surrounding the p-well 14, e.g., isolate the triggering device 18 and the SCR 20. The deep trench isolation structures 16 (and shallow trench isolation structures 25 of FIGS. 3 and 4) may be formed by conventional lithography, etching and deposition processes. For example, a resist formed over the semiconductor substrate 12 is exposed to energy (light) and developed utilizing a conventional resist developer to form a pattern (opening). An etching process with a selective chemistry, e.g., reactive ion etching (RIE), will be used to transfer the pattern from the photoresist layer to the semiconductor substrate 12 to form one or more trenches in the semiconductor substrate 12 through the openings of the resist. Following the resist removal by a conventional oxygen ashing process or other known stripants, insulator material (e.g., $SiO_2$) can be deposited by any conventional deposition processes, e.g., CVD processes. Any residual material on the surface of the semiconductor substrate 12 can be removed by conventional chemical mechanical polishing (CMP) processes.

Figure 9B:
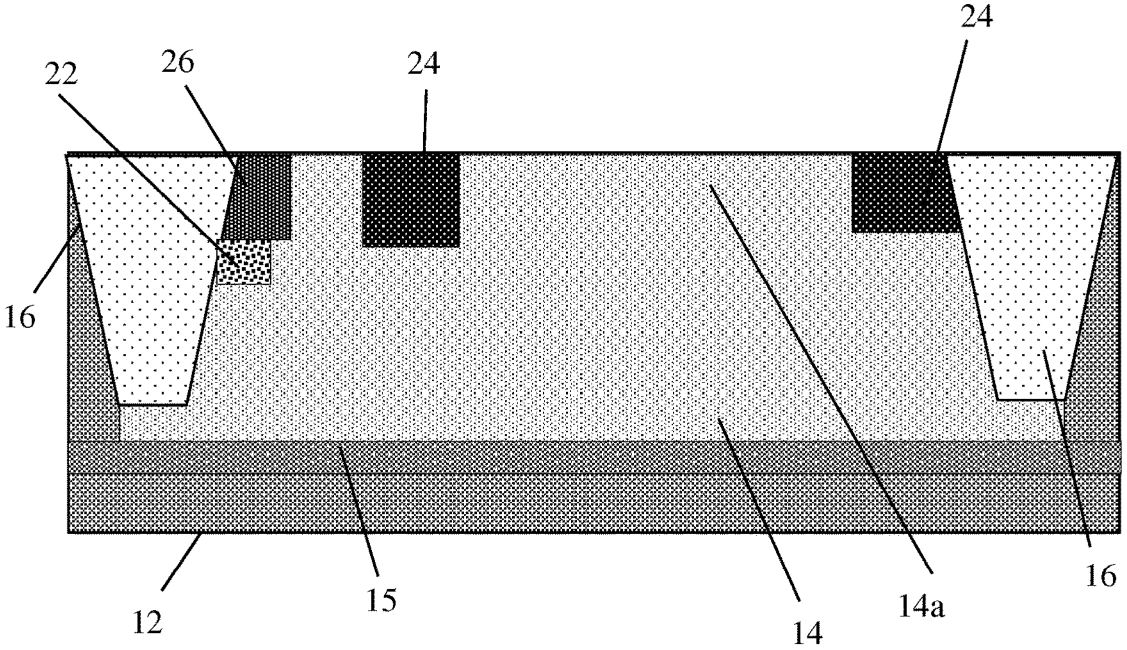

FIG. 9B shows the formation of the N+ diffusion regions 22, 24 and the body contact 26. The N+ diffusion regions 22, 24 and the body contact 26 may be formed by introducing a concentration of a different dopant of opposite conductivity type in the semiconductor substrate 12.

In embodiments, respective patterned implantation masks may be used to define selected areas exposed for the implantations. The implantation mask used to select the exposed area for forming N+ diffusion region 22 (or N+ diffusion region 24) is stripped after implantation, and before the implantation mask used to form the body contact 26 or N+ diffusion region 24 (or vice versa). Similarly, the implantation mask used to select the exposed area for forming body contact 26 (or N+ diffusion region 24) is stripped after the implantation is performed and prior to the next implantation process. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. The body contact 26 is doped with p-type dopants, e.g., Boron (B), and the N+ diffusion regions 22, 24 are doped with n-type dopants, e.g., Arsenic (As), Phosphorus (P) and Sb, among other suitable examples. It should be recognized that opposite dopant types may be used to form the structure 10*a* of FIG. 2.

Figure 9C:
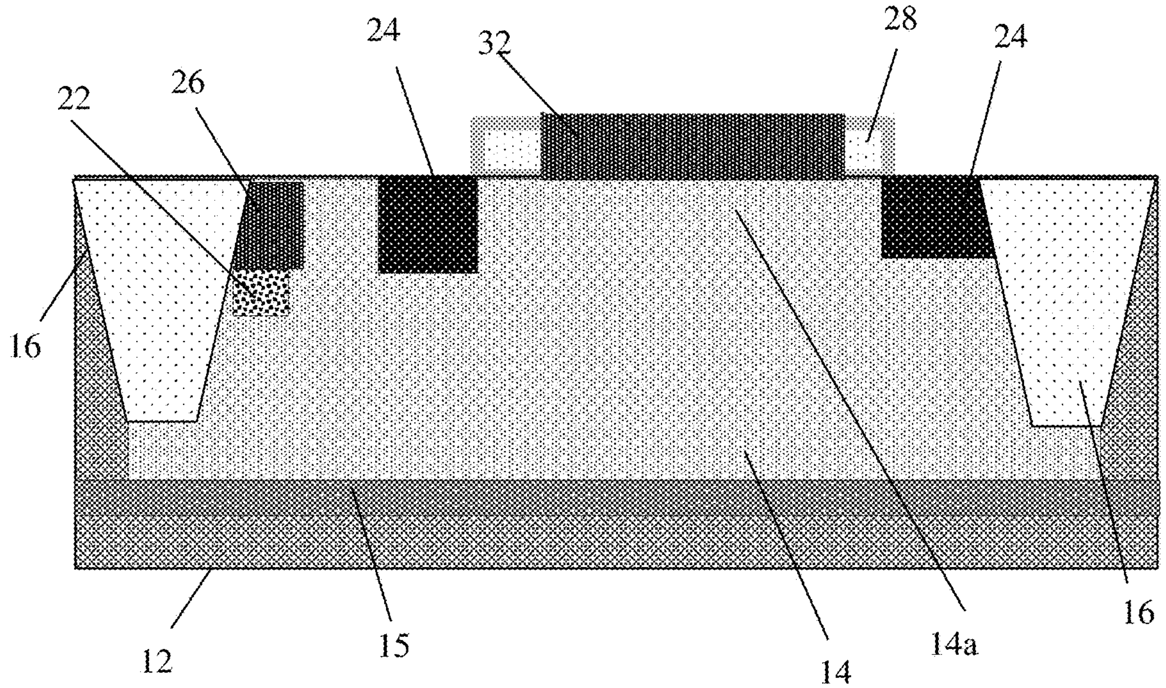

FIG. 9C shows the fabrication of the base region 32 and sidewall spacers 28. The base region 32 may be fabricated by a conventional epitaxial growth process with an in-situ doping. In the structure of FIG. 1, the doping would be an n-type dopant; whereas in the structure of FIG. 2, the doping would be a p-type dopant. Following a conventional patterning process, e.g., lithography and etching, the sidewall spacers 28 may be formed by a conventional deposition and an anisotropic etching process as already disclosed herein.

Figure 9D:
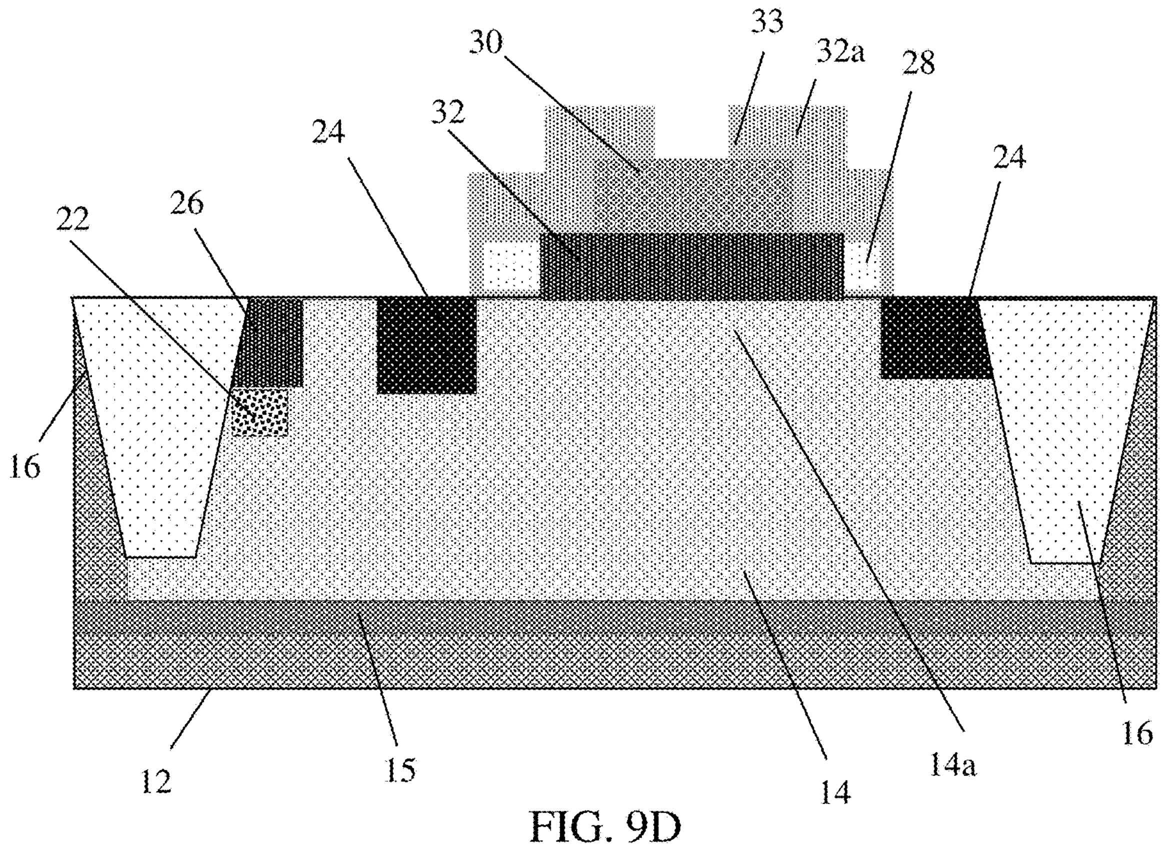

FIG. 9D shows the fabrication of the emitter region 30 and the tap region 32*a* (e.g., extrinsic base). The emitter region 30 may be fabricated by a conventional epitaxial growth process with an in-situ doping. In the structure of FIG. 1, the doping would be a p-type dopant; whereas in the structure of FIG. 2, the doping would be an n-type dopant. Following a conventional deposition process for forming sidewall spacers (insulator material) 33 and a patterning process to expose portions of the base region 32, the emitter region 30 may be epitaxially grown, in contact with the base region 32.

The silicide regions may be formed by conventional silicide processes. For example, as should be understood by those of skill in the art, the silicide process begins with deposition of a thin transition metal layer, e.g., nickel, cobalt or titanium, over fully formed and patterned semiconductor material (e.g., N+ and P+ diffusion regions, emitter, extrinsic base and portions of the wells 14, 15 between the respective diffusion regions FIGS. 5 and 6). After deposition of the material, the structure is heated allowing the transition metal to react with exposed silicon (or other semiconductor material as described herein) in the respective regions of the device forming a low-resistance transition metal silicide. Following the reaction, any remaining transition metal is removed by chemical etching, leaving silicide contacts in the active regions of the device.

Referring back to FIG. 1, wiring structures 34 are formed using conventional lithography, etching and deposition processes. For example, an interlevel dielectric material may be deposited by a conventional deposition method, e.g., CVD. The interlevel dielectric material may be deposited by conventional lithography and etching processes to form trenches exposing the extrinsic base region 32, P+ emitter 30, N+ diffusion region 24 and P+ body contact 26. A conductive material is deposited into the trenches to form the wiring structures 34. The conductive material may be aluminum, copper, tungsten or other known materials. To prevent out-diffusion, the sidewalls of the trenches may be lined with TaN or TiN as is known in the art.

The structures can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:

a vertical silicon controlled rectifier;

a lateral triggering device comprising a first diffusion region, a second diffusion region and a third diffusion region, the third diffusion region being shared with the vertical silicon controlled rectifier; and a body contact over the first diffusion region.

2. The structure of claim 1, wherein the first diffusion region and the third diffusion region comprise a first dopant type and the second diffusion region comprises a second dopant type.

3. The structure of claim 2, wherein the vertical silicon controlled rectifier comprises a PNPN device and the triggering device comprises a lateral NPN transistor.

4. The structure of claim 3, wherein the first dopant type is an N+ dopant and the second dopant type is a P+ dopant, and the second diffusion region is a p-well in a semiconductor substrate.

5. The structure of claim 4, wherein the body contact comprises a P+ diffusion region contacting the first diffusion region and extending into the p-well in the semiconductor substrate.

6. The structure of claim 2, wherein the vertical silicon controlled rectifier comprises an NPNP device and the triggering device comprises a lateral PNP transistor, with the first dopant type being a P+ dopant and the second dopant type being an N+ dopant, and the second diffusion region being an n-well in a semiconductor substrate.

7. The structure of claim 6, wherein the body contact comprises an N+ diffusion region contacting the first diffusion region and extending into the n-well in the semiconductor substrate.

8. The structure of claim 2, wherein the body contact is interdigitated with diffusion regions of the first dopant type over the first diffusion region.

9. The structure of claim 1, further comprising a trench isolation structure extending into the second diffusion region and between the first diffusion region and the third diffusion region.

10. The structure of claim 1, further comprising a silicide region over the second diffusion region and bridging the first diffusion region and the third diffusion region.

11. A structure comprising:

a vertical silicon controlled rectifier; and a lateral transistor configured to trigger the vertical silicon controlled rectifier, the lateral transistor comprising:

a first diffusion region of a first dopant type in a semiconductor substrate;

a second diffusion region of a second dopant type in the semiconductor substrate; and a third diffusion region of the first dopant type in the semiconductor substrate, wherein the vertical silicon controlled rectifier comprises a PNPN device, the lateral transistor comprises a lateral NPN transistor, and the PNPN device and the NPN transistor share the third diffusion region of the first dopant type.

12. The structure of claim 11, wherein the first dopant type is an N+ dopant and the second dopant type is a P+ dopant, and the second diffusion region is a p-well in the semiconductor substrate.

13. The structure of claim 12, further comprising a body contact comprises a P+ diffusion region contacting the first diffusion region and extending into the p-well in the semiconductor substrate.

14. A structure comprising:

a vertical silicon controlled rectifier; and a lateral transistor configured to trigger the vertical silicon controlled rectifier, the lateral transistor comprising:

a first diffusion region of a first dopant type in a semiconductor substrate;

a second diffusion region of a second dopant type in the semiconductor substrate; and a third diffusion region of the first dopant type in the semiconductor substrate, wherein the vertical silicon controlled rectifier comprises an NPNP device and the lateral transistor comprises a lateral PNP transistor, and the NPNP device and the PNP transistor share the third diffusion region of the first dopant type.

15. The structure of claim 14, wherein the first dopant type is a P+ dopant and the second dopant type is an N+ dopant, and the second diffusion region is an n-well in the semiconductor substrate.

16. The structure of claim 15, further comprising a body contact comprising an N+ diffusion contacting the first diffusion region and extending into the n-well in the semiconductor substrate.

17. A structure comprising:

a vertical silicon controlled rectifier; and a lateral transistor configured to trigger the vertical silicon controlled rectifier, the lateral transistor comprising:

a first diffusion region of a first dopant type in a semiconductor substrate;

a second diffusion region of a second dopant type in the semiconductor substrate; and a third diffusion region of the first dopant type in the semiconductor substrate; and a trench isolation structure extending into the second diffusion region and between the first diffusion region and the third diffusion region.

18. A structure comprising:

a vertical silicon controlled rectifier; and a lateral transistor configured to trigger the vertical silicon controlled rectifier, the lateral transistor comprising:

a first diffusion region of a first dopant type in a semiconductor substrate;

a second diffusion region of a second dopant type in the semiconductor substrate; and a third diffusion region of the first dopant type in the semiconductor substrate; and a silicide block over the second diffusion region and bridging the first diffusion region and the third diffusion region.

19. A method comprising:

forming a vertical silicon controlled rectifier;

forming a lateral triggering device comprising a first diffusion region, a second diffusion region and a third diffusion region, the third diffusion region being shared with the vertical silicon controlled rectifier; and forming a body contact tied to the first diffusion region.

* * * * *